United States Patent
Seyama

(10) Patent No.: US 11,062,964 B2
(45) Date of Patent: Jul. 13, 2021

(54) METHOD FOR MANUFACTURING SEMICONDUCTOR DEVICE, AND MOUNTING APPARATUS

(71) Applicant: SHINKAWA LTD., Tokyo (JP)

(72) Inventor: Kohei Seyama, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 0 days.

(21) Appl. No.: 16/337,927

(22) PCT Filed: Sep. 26, 2017

(86) PCT No.: PCT/JP2017/034640
§ 371 (c)(1),
(2) Date: Jun. 14, 2019

(87) PCT Pub. No.: WO2018/062129
PCT Pub. Date: Apr. 5, 2018

(65) Prior Publication Data
US 2019/0304852 A1   Oct. 3, 2019

(30) Foreign Application Priority Data

Sep. 29, 2016  (JP) .............................. JP2016-192217
Mar. 24, 2017  (JP) .............................. JP2017-058745
Jul. 28, 2017   (JP) .............................. JP2017-146399

(51) Int. Cl.
  *H01L 21/66*  (2006.01)
  *H01L 21/52*  (2006.01)
  *H01L 21/67*  (2006.01)

(52) U.S. Cl.
  CPC .............. *H01L 22/12* (2013.01); *H01L 21/52* (2013.01); *H01L 21/67144* (2013.01); *H01L 21/67259* (2013.01)

(58) Field of Classification Search
None
See application file for complete search history.

(56) References Cited

U.S. PATENT DOCUMENTS 8,530,120 B2   9/2013   Wahlsten et al.
8,594,824 B2   11/2013  Wahlsten et al.
(Continued)

FOREIGN PATENT DOCUMENTS

JP   S63169034    7/1988
JP   2000269242   9/2000
(Continued)

OTHER PUBLICATIONS

"International Search Report (Form PCT/ISA/210)" of PCT/JP2017/034640, dated Nov. 14, 2017, with English translation thereof, pp. 1-4.

*Primary Examiner* — Zandra V Smith
*Assistant Examiner* — Lawrence C Tynes, Jr.
(74) *Attorney, Agent, or Firm* — JCIPRNET

(57) ABSTRACT

A method for manufacturing a semiconductor device and a mounting apparatus are provided. The method for manufacturing a semiconductor device includes: a placing step for placing, on a bonding surface, a temporary substrate which is transmissive with respect to an alignment mark; an image acquisition step for acquiring an image of the alignment mark and an image of a semiconductor die; a correction step for correcting, on the basis of the image of the alignment mark and the image of the semiconductor die acquired in the image acquisition step, the position in the horizontal direction of a bonding head that pressure bonds the semiconductor die to the temporary substrate; and a pressure bonding step for pressure bonding the semiconductor die to the transmissive substrate on the basis of the corrected position in the horizontal direction.

19 Claims, 8 Drawing Sheets

(56) References Cited

U.S. PATENT DOCUMENTS

| | | | |
|---|---|---|---|
| 8,594,825 B2 | 11/2013 | Wahlsten et al. | |
| 9,032,342 B2 | 5/2015 | Wahlsten et al. | |
| 9,341,962 B2 | 5/2016 | Wahlsten et al. | |
| 2006/0002053 A1* | 1/2006 | Brown | H01L 21/6831 361/234 |
| 2006/0187432 A1* | 8/2006 | Yasuda | G03F 7/70341 355/53 |
| 2008/0094593 A1* | 4/2008 | Shibazaki | G03F 7/70341 355/53 |
| 2008/0245843 A1* | 10/2008 | Suga | B23K 20/023 228/3.1 |
| 2010/0259741 A1* | 10/2010 | Koga | G03F 9/7084 355/67 |
| 2012/0328725 A1* | 12/2012 | Minoda | B82Y 10/00 425/150 |
| 2016/0351532 A1* | 12/2016 | Akutsu | C09J 7/10 |

FOREIGN PATENT DOCUMENTS

| | | |
|---|---|---|
| JP | 2013520826 | 6/2013 |
| JP | 2016058543 | 4/2016 |

* cited by examiner

METHOD FOR MANUFACTURING SEMICONDUCTOR DEVICE, AND MOUNTING APPARATUS

CROSS-REFERENCE TO RELATED APPLICATION

This application is a 371 application of the international PCT application serial no. PCT/JP2017/034640, filed on Sep. 26, 2017, which claims the priority benefits of Japan application no. 2016-192217, filed on Sep. 29, 2016; Japan application no. 2017-058745, filed on Mar. 24, 2017; and Japan application no. 2017-146399, filed on Jul. 28, 2017. The entirety of each of the above-mentioned patent applications is hereby incorporated by reference herein and made a part of this specification.

BACKGROUND

Technical Field

The present invention relates to a method of manufacturing a semiconductor device, and a mounting apparatus.

Description of Related Art

Conventionally, fan-out type WLP (Wafer-Level-Packaging) has been proposed for the purposes of further downsizing semiconductor devices, improving the integration, and reducing the costs (for example, Patent Document 1).

In the fan-out type WLP, a semiconductor device is manufactured through the following processes.
1. A semiconductor wafer formed with circuit patterns is diced to singulate a plurality of semiconductor dies.
2. The semiconductor dies are pressure bonded onto a temporary substrate at predetermined intervals by using a mounting apparatus.
3. A plurality of semiconductor dies arranged on the temporary substrate are molded with resin.
4. The molded semiconductor dies are peeled off from the temporary substrate to expose the surfaces by which the semiconductor dies are pressure bonded to the temporary substrate.
5. A wiring layer and a bump electrode are formed on the exposed surface of the semiconductor die.
6. A plurality of molded semiconductor dies are diced to singulate the semiconductor dies formed with the wiring layers and the bump electrodes.

RELATED ART

Patent Document
[Patent Document 1] Japanese Laid-Open No. 2013-520826

SUMMARY

Problems to be Solved

However, in the process of pressure bonding the semiconductor dies at predetermined intervals, a temporary substrate without an alignment mark may be used. In such cases, the mounting apparatus will pressure bond the semiconductor dies to the temporary substrate based on mechanical coordinates of a linear encoder or the like.

When the semiconductor dies are pressure bonded to the temporary substrate based on the mechanical coordinates, due to deviation of the mechanical coordinates and thermal effects, there may be deviation in the position where the semiconductor die is pressure bonded to the temporary substrate, resulting in variation in the intervals between the semiconductor dies. Because variation in the intervals between the semiconductor dies results in the need to form a wiring layer with a size that allows for variation, it becomes a factor that hinders high integration and downsizing of the semiconductor dies. Furthermore, if the intervals between the semiconductor dies have a large variation, the semiconductor device will have a defect.

It is also expected that, even though an alignment mark is formed on the temporary substrate, the intervals between the semiconductor dies may still vary due to thermal expansion of the temporary substrate.

Therefore, the present invention is to provide a method of manufacturing a semiconductor device and a mounting apparatus that can suppress variation in the intervals between the semiconductor dies arranged on a temporary substrate.

Means for Solving the Problems

A manufacturing method of a semiconductor device is provided, which includes a placing process of placing a transmissive substrate on a bonding surface of a bonding stage that has an alignment mark formed on the bonding surface, wherein the transmissive substrate is transmissive to the alignment mark; an image acquisition process of imaging the alignment mark through the transmissive substrate from above the bonding stage with a camera, and acquiring an image of the alignment mark; a correction process of correcting a position in a horizontal direction of a bonding head, which pressure bonds a semiconductor die to the transmissive substrate, based on the image of the alignment mark acquired in the image acquisition process; and a pressure bonding process of pressure bonding the semiconductor die to the transmissive substrate based on a corrected position in the horizontal direction.

A mounting apparatus is provided, which includes a bonding head having a bonding tool that holds a semiconductor die on a suction surface, and pressure bonding the semiconductor die onto a transmissive substrate; a bonding stage having an alignment mark on a bonding surface, and carrying the transmissive substrate, which is transmissive to the alignment mark, on the bonding surface; a camera imaging the alignment mark through the transmissive substrate from above the bonding stage, and acquiring an image of the alignment mark; and a correction part correcting a position in a horizontal direction where the bonding head pressure bonds the semiconductor die to the transmissive substrate based on the image of the alignment mark acquired by the camera.

Effects

According to the present invention, it is possible to suppress variation in the intervals between the semiconductor dies arranged on the temporary substrate.

BRIEF DESCRIPTION OF THE DRAWINGS

FIG. 10(a) to FIG. 10(c) are schematic views showing the operation of the bonding head when pressure bonding semiconductor dies to the temporary substrate, wherein FIG. 10(a) shows the state before the bonding head is moved, FIG. 10(b) shows the state after the bonding head is moved, and FIG. 10(c) shows the state where semiconductor dies are continuously pressure bonded to the temporary substrate.

DESCRIPTION OF THE EMBODIMENTS

Figure 1:
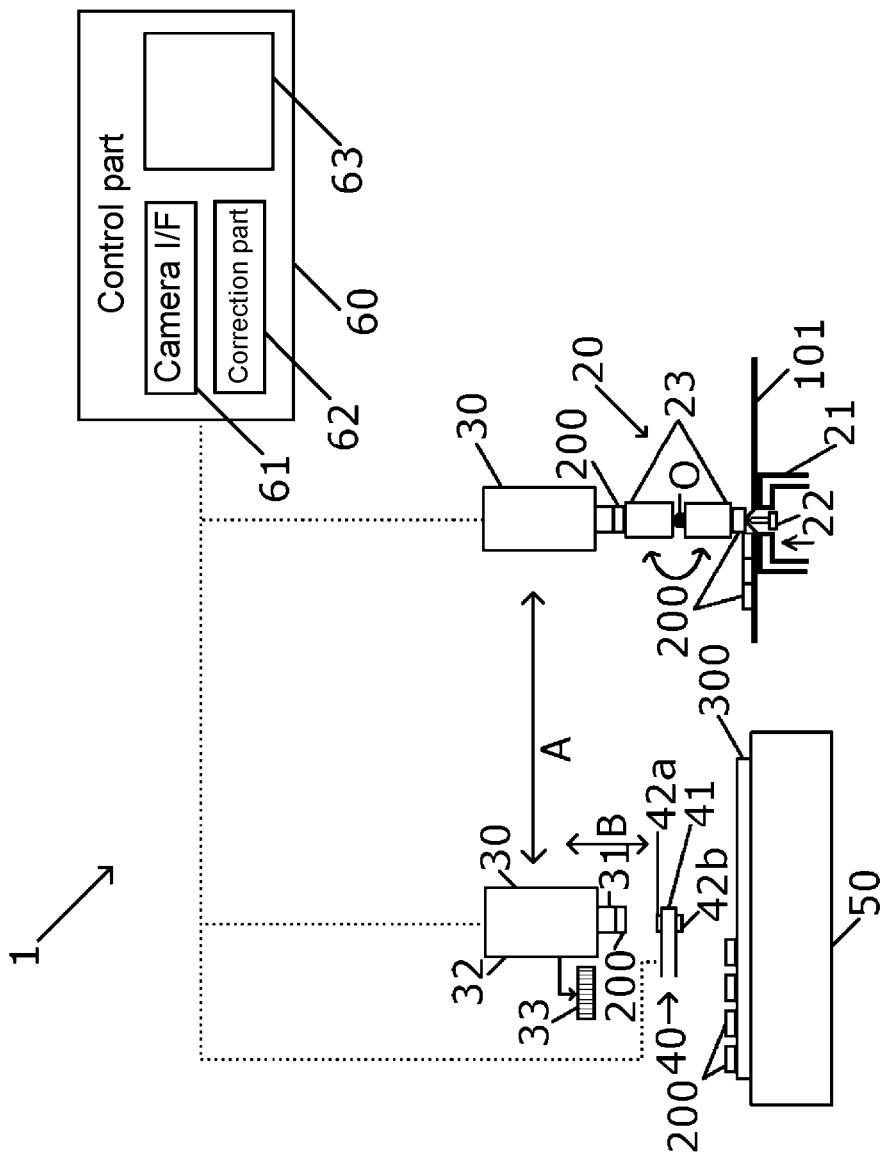
FIG. 1 is a schematic view showing the mounting device according to the first embodiment of the present invention.

Embodiments of the present invention will be described hereinafter. In the following description of the drawings, identical or similar components are denoted by identical or similar reference numerals. The drawings are illustrative and the dimensions and shape of each part are schematic, and the technical scope of the present invention should not be construed as being limited to the embodiments.

First Embodiment

FIG. 1 is a schematic view showing a mounting apparatus according to the first embodiment. As shown in FIG. 1, the mounting apparatus 1 includes a pickup part 20 for picking up a semiconductor die 200 from a diced semiconductor wafer 100; a bonding stage 50 for supporting a temporary substrate 300; a bonding head 30 moving between the pickup part 20 and the bonding stage 50; and a dual field camera 40 disposed above the bonding stage 50. The mounting apparatus 1 is a so-called flip chip bonder which flips over the semiconductor die 200 picked up from the semiconductor wafer 100 by 180 degrees in the thickness direction and mounts it to a substrate or the like. The temporary substrate 300 is an example of the transmissive substrate.

The pickup part 20 includes a pickup stage 21 for holding a dicing sheet 101 with the semiconductor wafer 100 attached thereto; a push-up pin 22 for pushing up the semiconductor die 200 from a through hole of the pickup stage 21 and peeling off the semiconductor die 200 from the dicing sheet 101; and a pickup head 23 for sucking and picking up the semiconductor die 200 that has been pushed up.

The pickup head 23 rotates around a rotational axis O and flips over the picked up semiconductor die 200 by 180 degrees in the thickness direction so that a surface of the semiconductor die 200 bonded to the dicing sheet 101 is directed upward.

The bonding head 30 is driven in a horizontal direction A parallel to a bonding surface 51 of the bonding stage 50 by an XY driving mechanism (not shown) and is driven in a vertical direction B orthogonal to the horizontal direction A by a Z-axis driving mechanism (not shown). The bonding head 30 further includes a bonding tool 31 for sucking and holding the semiconductor die 200.

The bonding head 30 drives the bonding tool 31 in the vertical direction B with a load control mechanism built in a body part 32 and controls the load when bonding the semiconductor die 200 sucked to the bonding tool 31. Further, the position and the movement amount of the bonding head 30 are controlled by reading a value of a linear encoder 33 during movement in the horizontal direction A.

In addition, a bonding heater is attached to the tip of the bonding tool 31 for heating the semiconductor die 200 in a range of 50° C. to 200° C. when the semiconductor die 200 is pressure bonded to the temporary substrate 300.

The dual field camera 40 includes an arm 41 movable above the bonding stage 50 by a driving mechanism (not shown); and two imaging elements 42a and 42b provided at the tip of the arm 41. The imaging elements 42a and 42b are provided on the same optical axis and face each other, and simultaneously image the semiconductor die 200 held by the bonding head 30, and the bonding stage 50 and the bonding surface 51.

Figure 2:
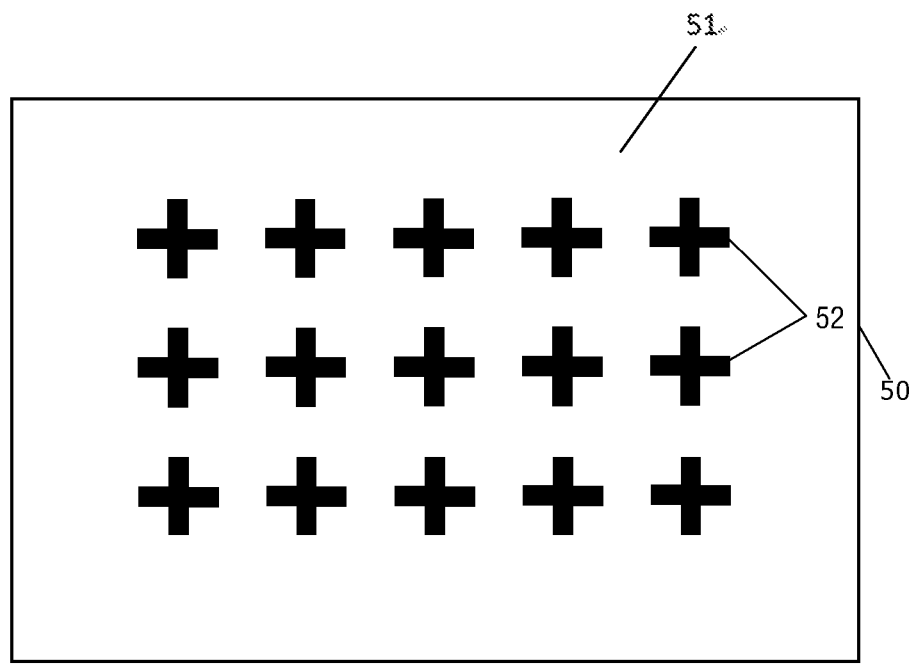
FIG. 2 is a top view showing the bonding stage.
Figure 3:
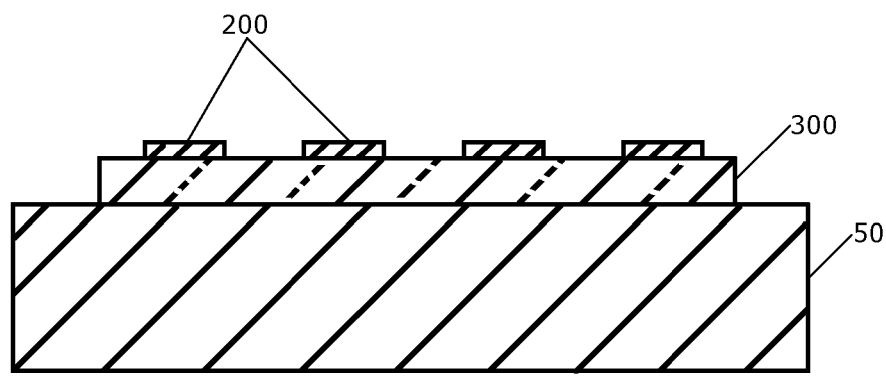
FIG. 3 is a side cross-sectional view showing the bonding stage and the temporary substrate with semiconductor dies mounted thereon.
Figure 4:
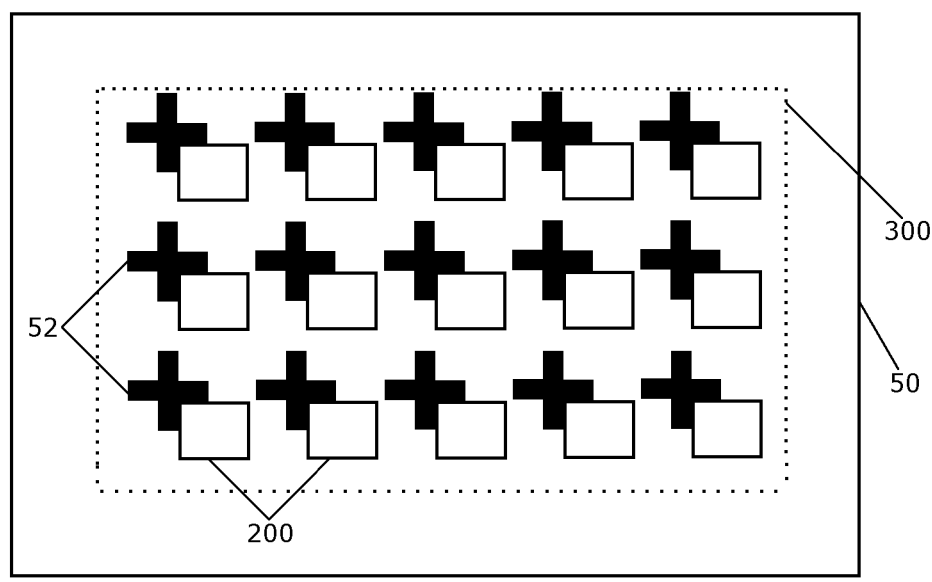
FIG. 4 is a top view showing the temporary substrate with semiconductor dies mounted thereon and the bonding stage.

FIG. 3 is a side cross-sectional view showing the bonding stage and the temporary substrate with the semiconductor dies mounted thereon, FIG. 2 is a top view showing the bonding stage, and FIG. 4 is a top view showing the bonding stage and the temporary substrate, and showing a state where the semiconductor dies are bonded.

The bonding stage 50 has the bonding surface 51 that vacuum-sucks and supports the temporary substrate 300 transported by a transport mechanism (not shown). As shown in FIG. 2, the bonding surface 51 is formed with a plurality of alignment marks 52, in a cross shape, in the region where the temporary substrate 300 is placed.

The alignment marks 52 are provided corresponding to the number of the semiconductor dies 200 to be mounted on the temporary substrate 300 at predetermined intervals. The alignment mark 52 is, for example, a mark formed by etching, plating, painting, grooving, etc., and can be in any form if the position of the alignment mark 52 can be recognized by the dual field camera 40.

The temporary substrate 300 placed on the bonding stage 50 allows light from the dual field camera 40 and light from the bonding stage 50 to pass through and allows the alignment mark 52 to be imaged by the dual field camera 40. The temporary substrate 300 is glass, for example, but may also be transparent resin, such as polycarbonate, acrylic, or polyester, or transparent ceramic. Further, to facilitate the peeling in the peeling process peeling off the molded semiconductor die 200 from the temporary substrate 300, a transparent film or coating layer may be provided on the temporary substrate 300.

As shown in FIG. 4, the semiconductor die 200 is pressure bonded to the temporary substrate 300 by the bonding head 30. The semiconductor die 200 is positioned so that its outer edge is along the outer edge of the cross-shaped alignment mark 52 through the temporary substrate 300, and the semiconductor dies 200 are pressure bonded to the temporary substrate 300 so that a constant distance is maintained between the semiconductor dies 200. A thermosetting adhesive layer such as a die attach film is formed on the semiconductor die 200 on the back surface side adhered to the dicing sheet 101. The semiconductor die 200 is fixed to the temporary substrate 300 by applying pressure and heat from the bonding head 30.

The mounting apparatus 1 further includes a control part 60 that controls each part of the apparatus according to a program read from a storage part 63. The control part 60 includes a camera I/F 61 for controlling the dual field camera 40 to image the semiconductor die 200 held by the bonding head 30 and the bonding stage 50 through the temporary substrate 300, and acquiring the respective images; and a correction part 62 for correcting the position of the bonding head 30 in the horizontal direction based on the images of the semiconductor die 200 and the bonding stage 50 that have been captured. The operation of each part of the control part 60 will be described later.

(Manufacturing Method of the Semiconductor Device)

Figure 5:
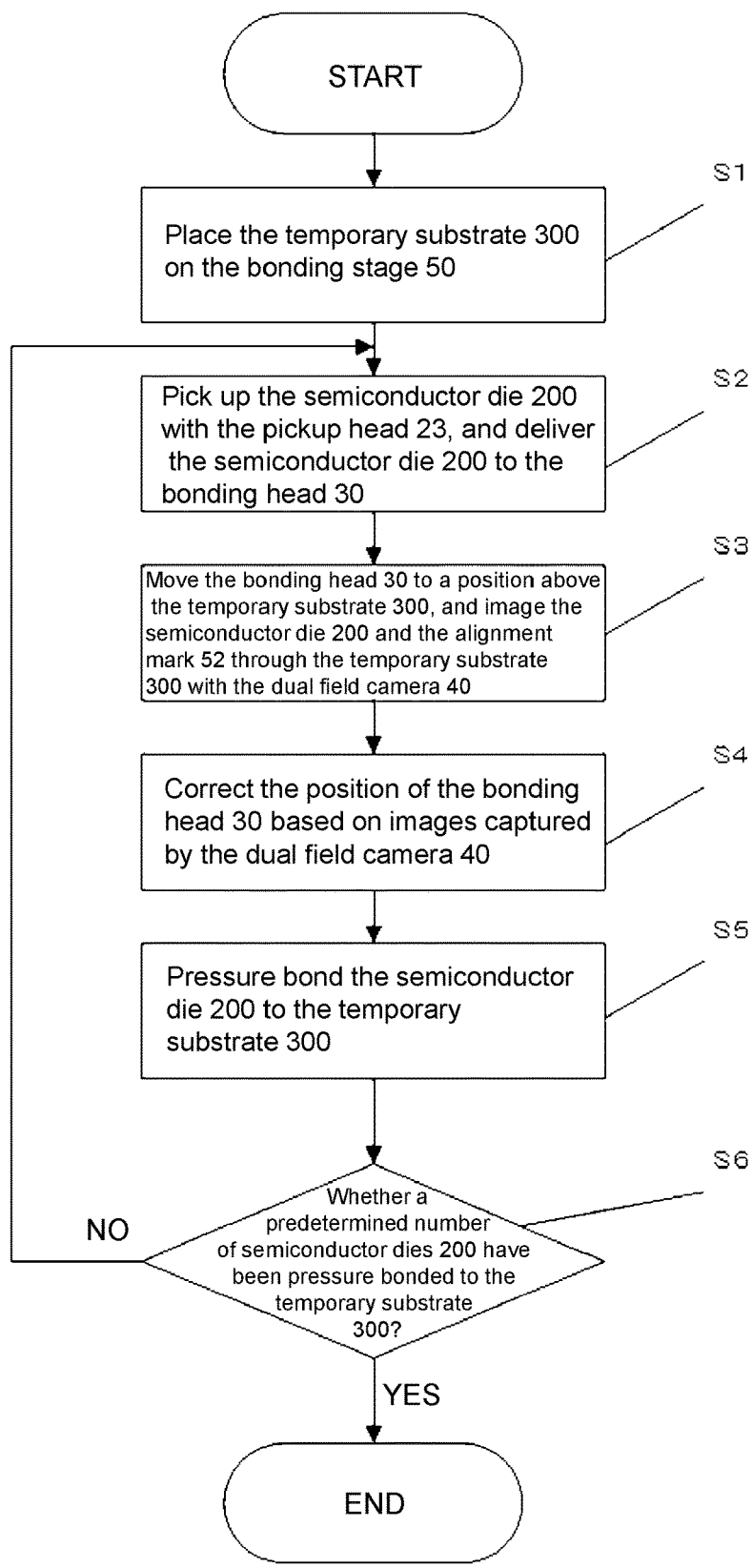
FIG. 5 is a flow chart showing the processes of pressure bonding semiconductor dies to the temporary substrate.

Next, a method of manufacturing a semiconductor device using the mounting apparatus 1 will be described. FIG. 5 is a flow chart showing the processes of pressure bonding the semiconductor die to the temporary substrate.

First, a transparent temporary substrate 300 is prepared, and the temporary substrate 300 is placed by a transport device (not shown) at a position where the alignment marks 52 on the bonding surface 51 are visible (S1). When the temporary substrate 300 is placed on the bonding surface 51, the bonding stage 50 vacuum-sucks and fixes the temporary substrate 300.

When the temporary substrate 300 is placed on the bonding stage 50, the pickup part 20 raises the push-up pin 22 and vacuum-sucks the semiconductor die 200 to pick up the semiconductor die 200 with the pickup head 23. When the semiconductor die 200 is picked up, the pickup head 23 is rotated around the rotational axis O by 180 degrees to deliver the semiconductor die 200 to the bonding head 30 (S2). The bonding head 30 sucks and holds the delivered semiconductor die 200.

When the semiconductor die 200 is delivered, the bonding head 30 is driven by the XY driving mechanism to move to a position above the temporary substrate 300. Next, the dual field camera 40 is moved to insert the arm 41 and the imaging elements 42a and 42b between the bonding head 30 and the bonding stage 50. The inserted imaging elements 42a and 42b image the semiconductor die 200 sucked and held by the bonding tool 31 and the alignment mark 52 through the temporary substrate 300 (S3). The captured images are stored in the storage part 63 by the camera I/F 61 and read by the correction part 62.

When the semiconductor die 200 and the alignment mark 52 are imaged, the position of the bonding head 30 is corrected based on the captured image (S4). Details of position correction of the bonding head 30 will be described later.

When the position of the bonding head 30 is corrected, the bonding head 30 and the bonding tool 31 are lowered, and pressure and heat are applied to the semiconductor die 200 to pressure bond the semiconductor die 200 to the temporary substrate (S5). When the semiconductor die 200 is pressure bonded, the control part 60 determines whether a predetermined number of semiconductor dies 200 have all been pressure bonded to the temporary substrate 300 (S6). If the control part 60 determines that not all the semiconductor dies 200 are pressure bonded (S6: NO), the mounting apparatus 1 repeats the processes S1 to S5 to pressure bond the semiconductor dies 200 onto the temporary substrate 300 at the predetermined intervals.

If the control part 60 determines that all the semiconductor dies 200 are pressure bonded in S6 (S6: YES), the mounting apparatus 1 completes the pressure bonding of the semiconductor dies 200 to the temporary substrate 300. The mounting apparatus 1 transports the temporary substrate 300 for which pressure bonding has been completed, and pressure bonds the semiconductor dies 200 to the next temporary substrate 300 as required.

(Position Correction of the Bonding Head)

Figure 6:
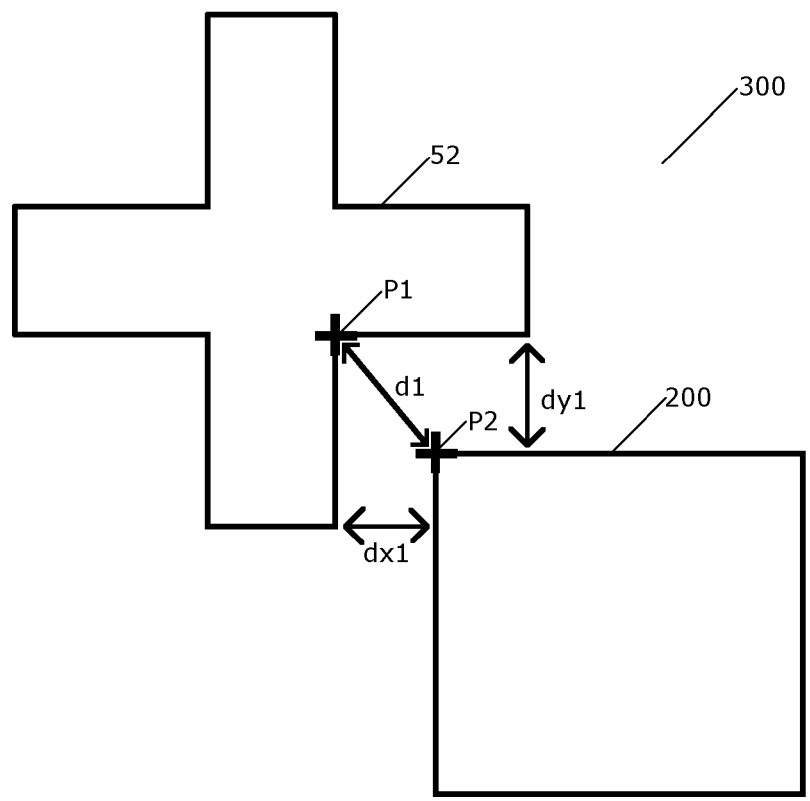
FIG. 6 is a schematic view showing the operation of the correction part when correcting the position of the bonding tool.

Next, the operation of the correction part 62 for correcting the position of the bonding head 30 will be described. FIG. 6 is a schematic view showing the operation of the correction part when correcting the position of the bonding tool.

When the camera I/F 61 stores the images obtained by imaging the semiconductor die 200 held on the bonding tool 31 and the alignment mark 52 in the storage part 63, the correction part 62 calculates the correction amount of the bonding head 30 based on the images stored in the storage part 63 as follows.

First, the correction part 62 searches for the alignment mark 52 at the pressure bonding position from the imaged bonding surface 51. When the correction part 62 finds the alignment mark 52, the correction part 62 calculates the coordinates of a first correction point P1 with the lower right portion of the cross-shaped alignment mark 52 as the first correction point P1.

Next, the correction part 62 calculates the coordinates of a second correction point P2 with the upper left corner of the semiconductor die 200 as the second correction point P2. When a distance d1 between the first and second correction points P1 and P2 is calculated, the correction part 62 derives the correction amounts dx1 and dy1 from the distance d1 between the first correction point P1 and the second correction point P2.

When the correction amounts dx1 and dy1 are derived, the bonding head 30 moves to the corrected position and pressure bonds the semiconductor die 200 to the temporary substrate 300.

(Effect of the Embodiment)

According to the present embodiment, the following effects are achieved.

(a) By using the bonding stage 50 formed with the alignment marks 52 on the bonding surface 51, a simple modification to the mounting apparatus 1 makes it possible to pressure bond the semiconductor dies 200 to the temporary substrate 300 with no variation.

(b) By correcting the position of the bonding head 30 based on the images captured by the dual field camera 40, the semiconductor dies 200 can be pressure bonded to the temporary substrate 300 without depending on mechanical coordinates of the linear encoder 33. Therefore, it is possible to pressure bond the semiconductor dies 200 with higher accuracy than pressure bonding based on mechanical coordinates.

(c) Since the semiconductor dies 200 can be pressure bonded to the temporary substrate 300 with no variation, it is not necessary to design the wiring layer, which is to be formed in the subsequent process, in consideration of the variation. Therefore, it is possible to achieve higher integration and further downsize the semiconductor device. Furthermore, it is possible to improve the yield when manufacturing the semiconductor device.

Second Embodiment

Figure 7:
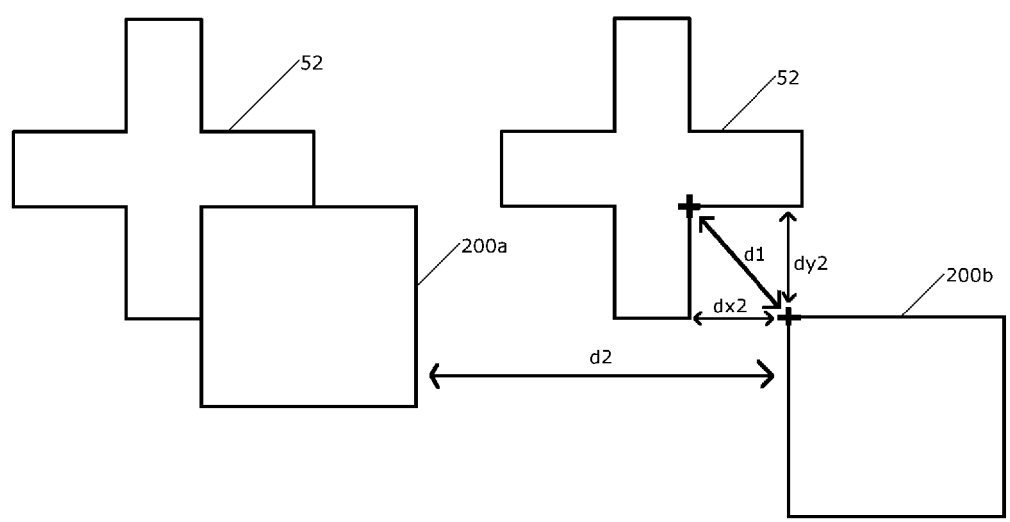
FIG. 7 is a schematic view showing the operation of the correction part when correcting the position of the bonding tool according to the second embodiment of the present invention.

FIG. 7 is a schematic view showing the operation of the correction part when correcting the position of the bonding tool according to the second embodiment of the present invention.

In the present embodiment, an operation performed when pressure bonding the second and subsequent semiconductor dies 200b is added to the operation of the mounting apparatus 1 of the first embodiment. The following description will focus on the difference between the first embodiment and the second embodiment.

When pressure bonding the second and subsequent semiconductor dies 200, the mounting apparatus 1 of the present embodiment also acquires the image of the semiconductor die 200a, which is already pressure bonded to the temporary substrate 300, in addition to the image of the semiconductor die 200b held by the bonding tool 31 and the image of the alignment mark 52. The correction part 62 calculates the distance d2 between the semiconductor die 200a and the semiconductor die 200b.

The correction part 62 derives the correction amounts dx2 and dy2 for correcting the position of the bonding head 30 so as to set the first coordinate point p1 of the alignment mark 52, the second coordinate point p2 of the semiconductor die 200b, and the distance d1, d2 between the semiconductor die 200a and the semiconductor die 200b at the predetermined intervals. Although the present embodiment illustrates a case where one semiconductor die 200a is already pressure bonded, it is certainly possible to derive the correction amounts dx2 and dy2 based on the distances d2 between the semiconductor die 200b and a plurality of pressure bonded semiconductor dies 200a.

(Effect of the Embodiment)

By correcting the position of the bonding head 30 with the correction amounts dx2 and dy2 to set the distance d2 between the pressure bonded semiconductor die 200a and the semiconductor die 200b held by the bonding tool 31 at the predetermined interval, it is possible to pressure bond the semiconductor dies 200 to the temporary substrate 300 at constant intervals with high accuracy.

Third Embodiment

Figure 8:
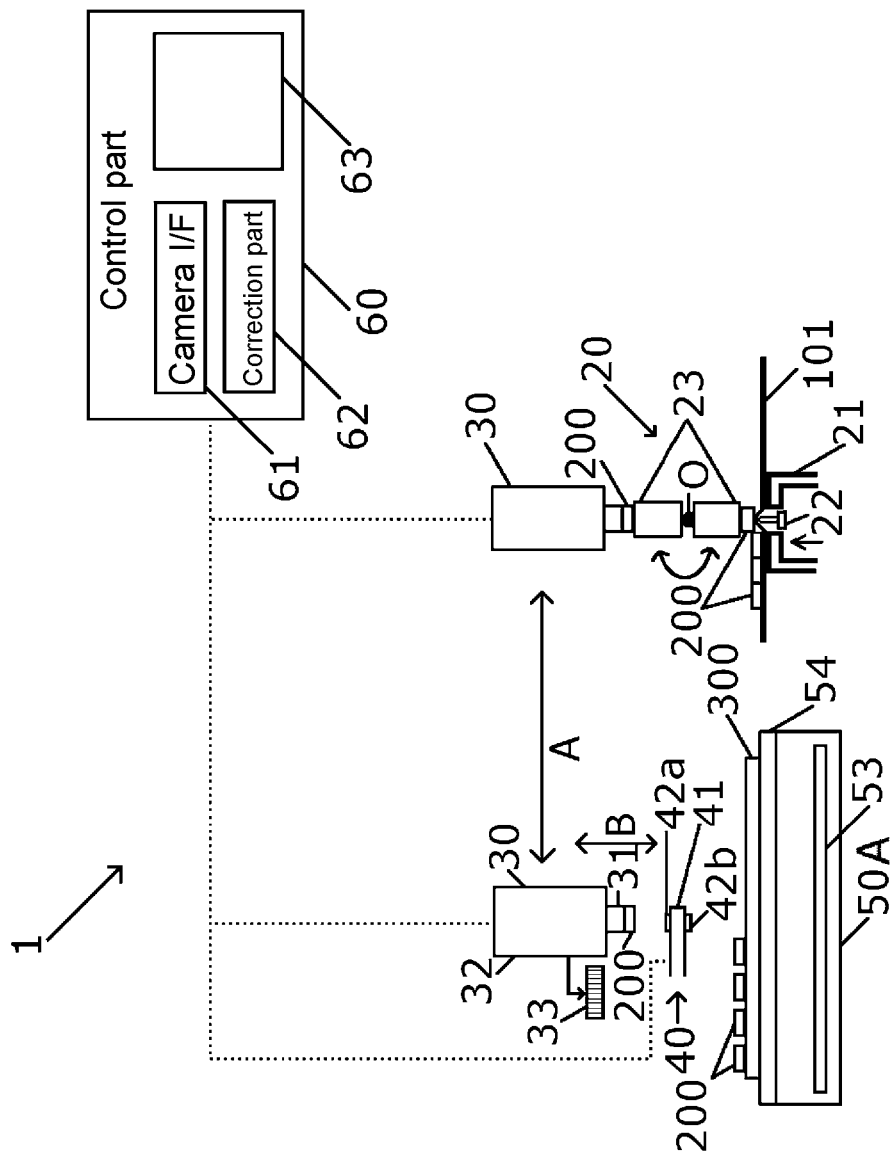
FIG. 8 is a schematic view showing the mounting apparatus according to the third embodiment of the present invention.

FIG. 8 is a schematic view showing the mounting apparatus according to the third embodiment. The following description will focus on the difference between the third embodiment and the first and second embodiments.

The bonding stage 50A of the present embodiment includes a bonding part 54 which incorporates a heater 53 for heating the temporary substrate 300 from below and is made of a material having a thermal expansion coefficient substantially the same as that of the material of the temporary substrate 300. A surface of the bonding part 54 forms the bonding surface 51 for placing the temporary substrate 300, and the bonding part 54 is made of the same material as the temporary substrate 300, for example. The entire bonding stage 50A may have a thermal expansion coefficient substantially the same as that of the temporary substrate 300.

When the semiconductor die 200 is pressure bonded, the heater 53 heats the temporary substrate 300 placed on the bonding stage 50A in the range of 50° C. to 200° C. By heating the semiconductor die 200 from the bonding stage 50A in addition to the bonding heater of the bonding head 30, the adhesive layer of the semiconductor die 200 can be heated efficiently and uniformly.

(Effect of the Embodiment)

In a case where the bonding stage 50A and the temporary substrate 300 have different thermal expansion coefficients, even though the semiconductor die 200 is pressure bonded to the temporary substrate 300 with the position of the bonding head 30 corrected, the temperature of the bonding stage 50A and the temporary substrate 300 may still cause variation in the intervals between the semiconductor dies 200.

However, by making the thermal expansion coefficients of the bonding stage 50A and the temporary substrate 300 substantively the same, temperature-dependent variation between the bonding stage 50A and the temporary substrate 300 can be suppressed. Since the variation can be suppressed even when the temporary substrate 300 is heated by the heater 53, it is possible to pressure bond the semiconductor die 200 to the temporary substrate 300 at a higher speed and with higher accuracy than a configuration that does not provide heating.

Fourth Embodiment

Figure 9:
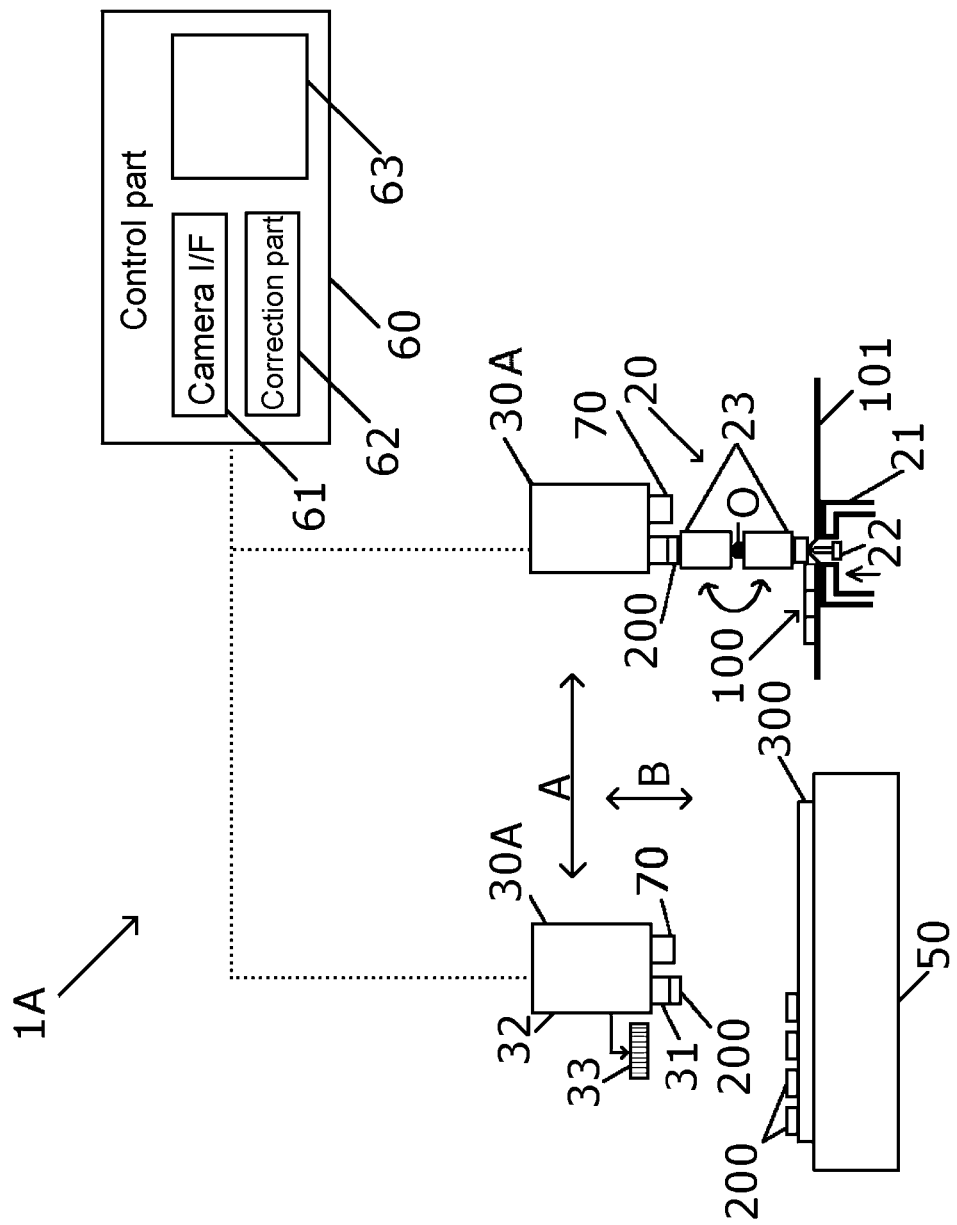
FIG. 9 is a schematic view showing the mounting apparatus according to the fourth embodiment of the present invention.
Figure 10A:
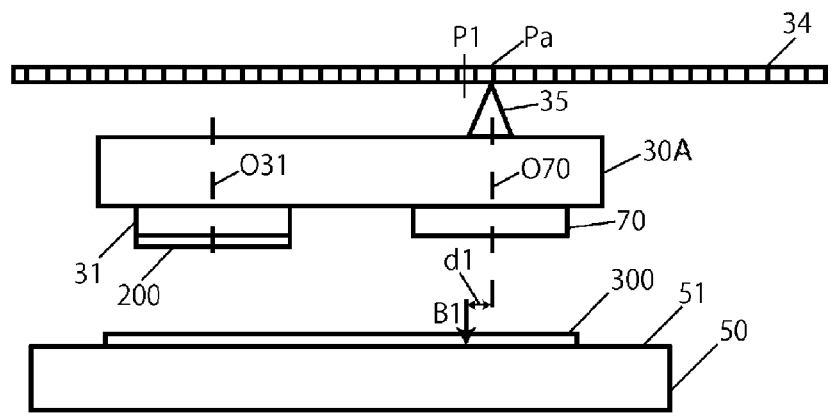
Figure 10B:
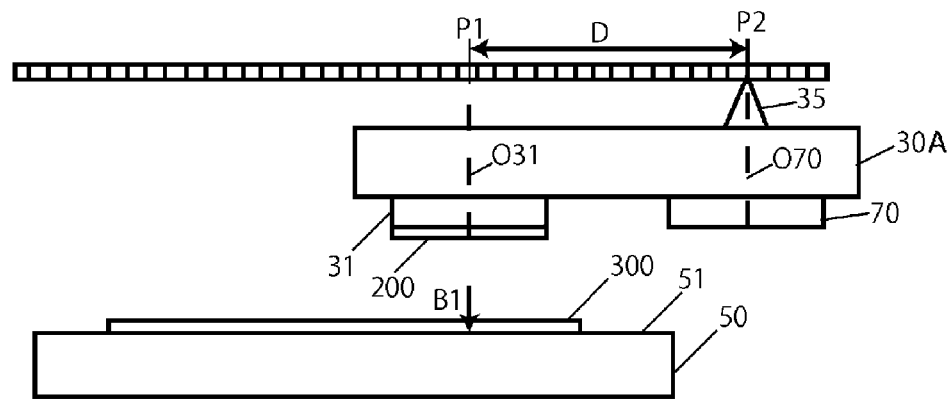
Figure 10C:
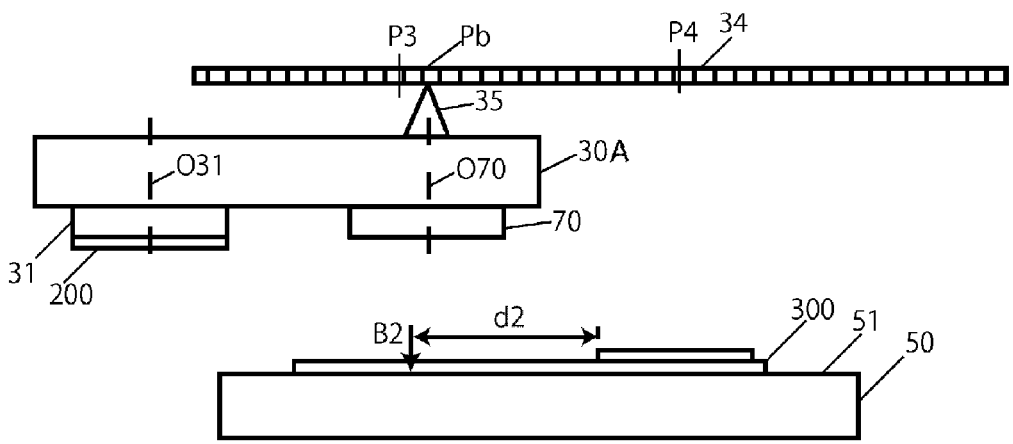

FIG. 9 is a schematic view showing the mounting apparatus according to the fourth embodiment. FIG. 10(a) to FIG. 10(c) are schematic views showing the operation of the bonding head when pressure bonding the semiconductor dies to the temporary substrate, wherein FIG. 10(a) shows the state before the bonding head is moved, FIG. 10(b) shows the state after the bonding head is moved, and FIG. 10(c) shows the state where the semiconductor dies are continuously pressure bonded to the temporary substrate.

The first embodiment illustrates the camera as a dual field camera 40 inserted between the bonding head 30 and the bonding stage 50, but the camera 70 of the present embodiment is different in that it is provided on the bonding head 30A. The following description will focus on the difference between the first embodiment and the fourth embodiment. Although the present embodiment illustrates correction along only the X axis, it is certainly applicable to only the Y direction or to two directions, i.e. X and Y axes.

The mounting apparatus 1A of the present embodiment includes a bonding head 30A having the bonding tool 31 and the camera 70; and a linear encoder 33 having a linear scale 34 and a detection part 35. The bonding tool 31 and the camera 70 are provided on the bonding head 30A such that the central axis O31 of the bonding tool 31 and the optical axis O70 of the camera 70 are separated by a predetermined separation distance D. The camera 70 images the temporary substrate 300 and the bonding stage 50 from above when the bonding tool 31 pressure bonds the semiconductor die 200 to the temporary substrate 300. In addition, although the alignment marks 52 are omitted from FIG. 10(a) to FIG. 10(c), a plurality of alignment marks 52, the same as those shown in FIG. 2, are formed at equal intervals on the bonding surface 51 of the bonding stage 50.

When the mounting apparatus 1A starts the bonding operation to pressure bond the semiconductor die 200 to the temporary substrate 300, the control part 60 controls the pickup part 20 to pick up the semiconductor die 200 from the semiconductor wafer 100, and drives the bonding head 30A to move the semiconductor die 200 to a predetermined position above the bonding stage 50.

When the semiconductor die 200 is moved to the predetermined position of the bonding stage 50, the camera I/F 61 controls the camera 70 to image the temporary substrate 300 and the alignment mark 52 on the bonding surface 51, and stores the captured images in the storage part 63. The correction part 62 detects the position of the alignment mark 52 from the captured image, and derives the bonding position B1 for pressure bonding the semiconductor die 200 to the temporary substrate 300 from the position of the alignment mark 52.

Based on the derived bonding position B1, the correction part 62 takes the difference between the current coordinates Pa read by the detection part 35 and the bonding position B1, for example, as the distance d1 to calculate the bonding coordinates P1 on the linear scale 34.

When the bonding coordinates P1 are calculated, the control part 60 calculates the bonding coordinates P2 by adding or subtracting the separation distance D to or from the bonding coordinates P1, and moves the bonding head 30A to the bonding coordinates P2. In other words, the control part 60 moves the bonding head 30 by the separation distance D such that the central axis O31 of the bonding tool 31 and the semiconductor die 200 is positioned at the bonding coordinates P1.

When the bonding head 30A is moved to the bonding coordinates P1, the control part 60 lowers the bonding tool 31 to pressure bond the semiconductor die 200 to the bonding position B1 on the temporary substrate 300.

Further, when the semiconductor dies are continuously pressure bonded to the temporary substrate 300, the correction part 62 calculates, for example, the distance d2 based on the semiconductor die 200 that is already pressure bonded and the detected alignment mark 52 to add or subtract the distance d2 to or from the current position Pb, and derives the bonding coordinates P3. That is, the bonding coordinates P3 are derived such that, in addition to the position of the alignment mark 52, the semiconductor die 200 that is already pressure bonded and the semiconductor die 200 held by the bonding tool are separated by a pre-designed distance.

When the bonding coordinates P3 are derived, the control part 60 moves the bonding head 30A to the bonding coordinates P4 obtained by adding or subtracting the separation distance D, and then pressure bonds the semiconductor die 200 to the bonding position B2.

Modified Example

Although the embodiments illustrate that the alignment mark 52 has a cross shape, it may be a dotted mark having a polygonal shape such as circle and quadrangle, or a linear mark such as lattice. In addition, the suction holes formed on the bonding surface 51 may serve as the alignment marks 52.

Also, although the outer edges of the alignment mark 52 and the semiconductor die 200 are used as the correction points P1 and P2, the center point of the alignment mark 52 or the semiconductor die 200 may be calculated to be used as the correction point for correcting the position of the bonding head 30.

Moreover, the alignment mark 52 may be a mark for coordinate detection, which is disposed on the bonding surface 51 at a constant distance. In such a case, the correction part 62 may detect the coordinates of the bonding head 30 based on the image captured by the dual field camera 40 and compare the coordinates with predetermined coordinates to correct the position of the bonding head 30.

In addition, although the embodiments illustrate that the mounting apparatus 1 flips the semiconductor die 200 over, the semiconductor die 200 may be pressure bonded to the temporary substrate 300 without being flipped over.

It suffices if a portion of the temporary substrate 300 is transmissive with respect to the alignment mark 52. For example, a groove may be formed in a portion of the temporary substrate 300 where no semiconductor die 200 is pressure bonded by using a metal plate or the like. Moreover, the temporary substrate 300 may be obtained by laminating an opaque material such as metal and a transparent material such as glass.

Also, in the fourth embodiment, the detection part 35 of the linear encoder 33 is not necessarily provided on one bonding head 30A and may be provided on a plurality of bonding heads 30A, and may be provided on the side of the bonding tool 31 of the bonding head 30A.

In addition, the temporary substrate 300 is not limited to a transparent member such as glass and may be made of a material such as silicon that is opaque to visible light but is transmissive to an infrared ray. In that case, an infrared camera that detects an infrared ray is used as the dual field camera 40 or the camera 70. The dual field camera 40 or the camera 70 emits an infrared ray to the temporary substrate 300 and detects the infrared ray reflected by the alignment mark 52.

Furthermore, the temporary substrate 300 may be transmissive with respect to not only an infrared ray but also electromagnetic waves such as ultraviolet ray, X-ray, and γ-ray. A camera that detects these electromagnetic waves can be used as the dual field camera 40 or the camera 70.

What is claimed is:

1. A manufacturing method of a semiconductor device, comprising:

a placing process of placing a transmissive substrate on a bonding surface of a bonding stage that has an alignment mark formed on the bonding surface, wherein the transmissive substrate is transmissive to the alignment mark;

an image acquisition process of imaging the alignment mark through the transmissive substrate from above the bonding stage with a camera, and acquiring an image of the alignment mark;

a correction process of correcting a position in a horizontal direction of a bonding head, which pressure bonds a semiconductor die to the transmissive substrate, based on the image of the alignment mark acquired in the image acquisition process; and a pressure bonding process of pressure bonding the semiconductor die to the transmissive substrate based on a corrected position in the horizontal direction, wherein after the placing process, the image acquisition process, the correction process, and the pressure bonding process are repeated a plurality of times to pressure bond a plurality of the semiconductor dies onto the transmissive substrate, the image acquisition process acquires the image of the alignment mark through the transmissive substrate and an image of the semiconductor die bonded onto the transmissive substrate, and the correction process corrects a position in the horizontal direction of a bonding tool so that the semiconductor die bonded onto the transmissive substrate and the semiconductor die held by the bonding tool have a predetermined interval, based on the images acquired in the image acquisition process.

2. The manufacturing method of the semiconductor device according to claim 1, wherein the camera is an upper and lower dual field camera that is inserted between the bonding stage and the bonding tool and simultaneously images an upper surface of the bonding stage and a lower surface of the semiconductor die held by the bonding tool.

3. The manufacturing method of the semiconductor device according to claim 2, further comprising a heating process of heating the transmissive substrate placed on the bonding surface with a heater incorporated in the bonding stage, wherein the pressure bonding process pressure bonds the semiconductor die to the heated bonding surface, and the bonding surface has a thermal expansion coefficient equal to a thermal expansion coefficient of the transmissive substrate.

4. The manufacturing method of the semiconductor device according to claim 1, wherein the correction process corrects a position in the horizontal direction where the semiconductor die is pressure bonded to the transmissive substrate based on the image of the alignment mark captured by the camera that is provided at a position separated from the bonding tool by a predetermined separation distance, and moves the bonding head so that the bonding tool is positioned at a corrected position in the horizontal direction, and
the pressure bonding process pressure bonds the semiconductor die to the transmissive substrate with the bonding tool moved to the corrected position in the horizontal direction.

5. The manufacturing method of the semiconductor device according to claim 4, further comprising a heating process of heating the transmissive substrate placed on the bonding surface with a heater incorporated in the bonding stage,
wherein the pressure bonding process pressure bonds the semiconductor die to the heated bonding surface, and
the bonding surface has a thermal expansion coefficient equal to a thermal expansion coefficient of the transmissive substrate.

6. The manufacturing method of the semiconductor device according to claim 1, further comprising a heating process of heating the transmissive substrate placed on the bonding surface with a heater incorporated in the bonding stage,
wherein the pressure bonding process pressure bonds the semiconductor die to the heated bonding surface, and
the bonding surface has a thermal expansion coefficient equal to a thermal expansion coefficient of the transmissive substrate.

7. The manufacturing method of the semiconductor device according to claim 1, wherein the transmissive substrate is opaque to visible light and is transmissive to an electromagnetic wave in a wavelength band excluding the visible light, and
the camera detects the electromagnetic wave in the wavelength band excluding the visible light to image the alignment mark.

8. The manufacturing method of the semiconductor device according to claim 7, wherein the transmissive substrate is transmissive to an infrared ray, and
the camera images the alignment mark by the infrared ray.

9. The manufacturing method of the semiconductor device according to claim 1, further comprising a heating process of heating the transmissive substrate placed on the bonding surface with a heater incorporated in the bonding stage,
wherein the pressure bonding process pressure bonds the semiconductor die to the heated bonding surface, and
the bonding surface has a thermal expansion coefficient equal to a thermal expansion coefficient of the transmissive substrate.

10. The manufacturing method of the semiconductor device according to claim 1, wherein the transmissive substrate is opaque to visible light and is transmissive to an electromagnetic wave in a wavelength band excluding the visible light, and
the camera detects the electromagnetic wave in the wavelength band excluding the visible light to image the alignment mark.

11. A mounting apparatus, comprising: a bonding head having a bonding tool that holds a semiconductor die on a suction surface, for pressure bonding the semiconductor die onto a transmissive substrate; a bonding stage having an alignment mark on a bonding surface, for carrying the transmissive substrate, which is transmissive to the alignment mark, on the bonding surface; a camera for imaging the alignment mark through the transmissive substrate from above the bonding stage, and acquiring an image of the alignment mark; and a correction part for correcting a position in a horizontal direction where the bonding head pressure bonds the semiconductor die to the transmissive substrate based on the image of the alignment mark acquired by the camera.

12. The mounting apparatus according to claim 11, wherein the camera is a dual field camera that is inserted between the bonding stage and the bonding head and simultaneously images an upper surface of the bonding stage and a lower surface of the semiconductor die held by the bonding head.

13. The mounting apparatus according to claim 11, wherein the correction part corrects the position in the horizontal direction where the semiconductor die is pressure bonded to the transmissive substrate based on the image of the alignment mark captured by the camera that is provided at a position separated from the bonding tool by a predetermined separation distance, and moves the bonding head so that the bonding tool is positioned at a corrected position in the horizontal direction, and
the bonding head pressure bonds the semiconductor die to the transmissive substrate with the bonding tool moved to the corrected position in the horizontal direction.

14. The mounting apparatus according to-claim 11, wherein the bonding stage comprises a heater heating the transmissive substrate placed on the bonding surface, and is made of a material having a thermal expansion coefficient equal to a thermal expansion coefficient of the transmissive substrate.

15. The mounting apparatus according to claim 11, wherein the transmissive substrate is opaque to visible light and is transmissive to an electromagnetic wave in a wavelength band excluding the visible light, and
the camera detects the electromagnetic wave in the wavelength band excluding the visible light to image the alignment mark.

16. The mounting apparatus according to claim 15, wherein the transmissive substrate is transmissive to an infrared ray, and
the camera detects the infrared ray to image the alignment mark.

17. The mounting apparatus according to claim 12, wherein the bonding stage comprises a heater heating the transmissive substrate placed on the bonding surface, and is made of a material having a thermal expansion coefficient equal to a thermal expansion coefficient of the transmissive substrate.

18. The mounting apparatus according to claim 13, wherein the bonding stage comprises a heater heating the transmissive substrate placed on the bonding surface, and is made of a material having a thermal expansion coefficient equal to a thermal expansion coefficient of the transmissive substrate.

19. The mounting apparatus according to claim 12, wherein the transmissive substrate is opaque to visible light and is transmissive to an electromagnetic wave in a wavelength band excluding the visible light, and the camera detects the electromagnetic wave in the wavelength band excluding the visible light to image the alignment mark.

\* \* \* \* \*